United States Patent [19]

Brenndoerfer et al.

[11] Patent Number: 5,406,114
[45] Date of Patent: Apr. 11, 1995

[54] BIPOLAR HIGH-FREQUENCY TRANSISTOR

[75] Inventors: Knut Brenndoerfer, Ismaning; Jakob Huber, Beyharting, both of Germany

[73] Assignee: Siemens Aktiengesellschaft, Munich, Germany

[21] Appl. No.: 159,598

[22] Filed: Dec. 1, 1993

[30] Foreign Application Priority Data

Dec. 18, 1992 [EP] European Pat. Off. ......... 92121628

[51] Int. Cl.⁶ .............. H01L 29/50; H01L 29/40; H01L 27/082
[52] U.S. Cl. .................... 257/584; 257/587; 257/692
[58] Field of Search ........... 257/584, 587, 678, 684, 257/564, 781, 666, 728, 692

[56] References Cited

U.S. PATENT DOCUMENTS 3,864,727  2/1975  Schoberl ............... 257/584
4,075,039  2/1978  Sloan, Jr. ............... 257/564

FOREIGN PATENT DOCUMENTS 0439652  8/1991  European Pat. Off.
1914442  1/1971  Germany.
0152650  2/1983  Japan.
59-152650  12/1984  Japan.
4-147658  5/1992  Japan.

*Primary Examiner*—William Mintel
*Assistant Examiner*—Wael M. Fahmy
*Attorney, Agent, or Firm*—Hill, Steadman & Simpson

[57] ABSTRACT

A high-frequency transistor has a suitably doped and structured semiconductor chip (1) that is composed of a doped Si substrate and has base, collector and emitter contactings (2, 3, 4). The chip (1) is surrounded by a housing (8), the contacts being connected to the respective base, collector and emitter terminals (6, 7, 5) of the housing. With the housing the transistor has a high gain at frequencies above 1 GHz. The base, collector and emitter contacts (2, 3, 4) are provided at the upper side of the semiconductor chip (1). The semiconductor chip (1) has its underside arranged on the emitter terminal (5) of the housing (8) which is fashioned as HF ground. The emitter contact (4) is connected over a short distance to the emitter terminal (5) of the housing (8). The base and collector contacts (2, 3) are each respectively connected via at least one bond wire (9) to the respective base or collector terminals (6, 7).

20 Claims, 1 Drawing Sheet

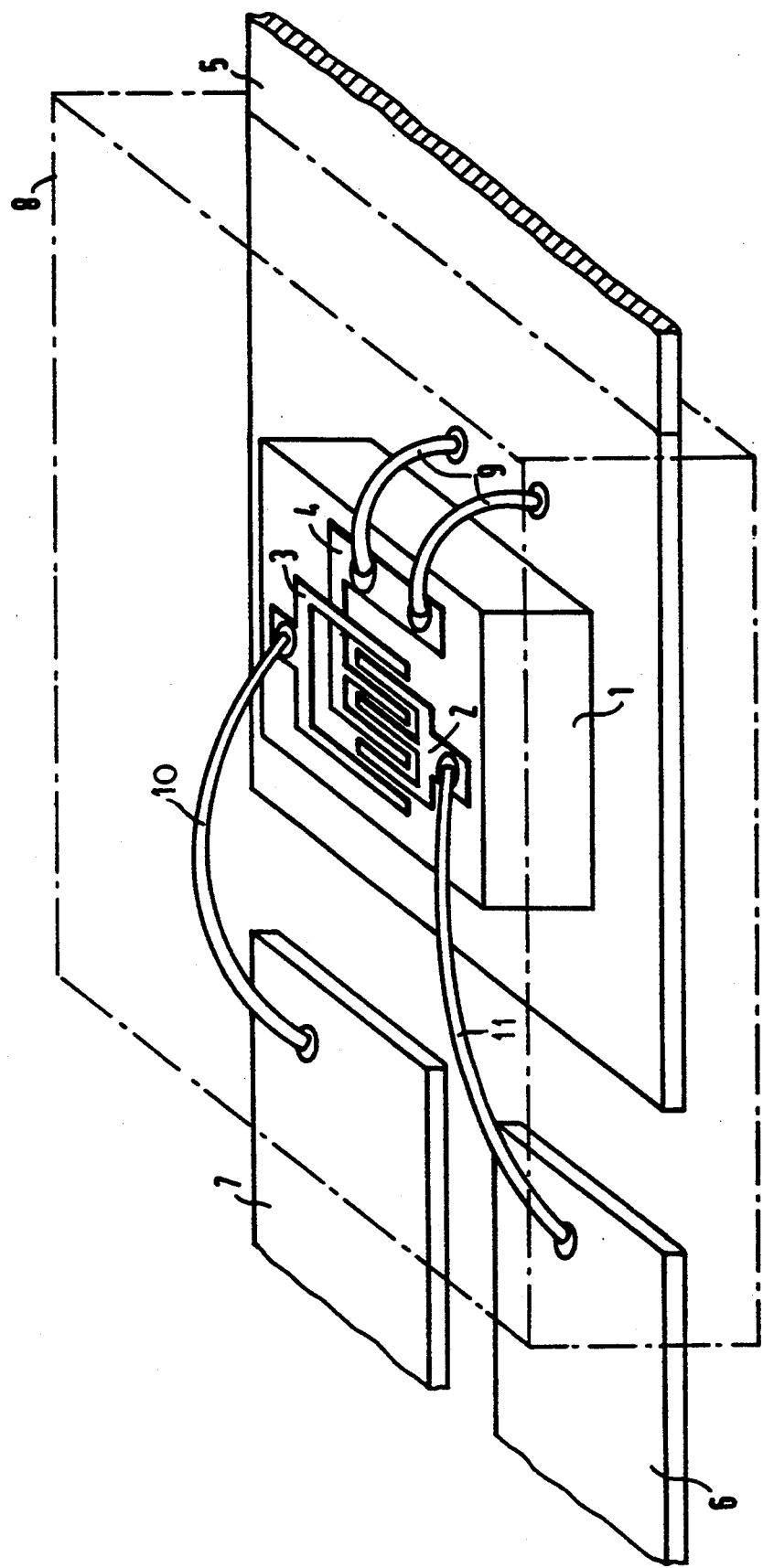

BIPOLAR HIGH-FREQUENCY TRANSISTOR

BACKGROUND OF THE INVENTION

The present invention is directed to a bipolar high-frequency transistor having a suitably doped and structured semiconductor chip of a doped silicon substrate and has base, collector and emitter contactings. The semiconductor chip is enclosed by a housing and the contacting thereof is connected to the respective base, collector and emitter terminals of the housing.

Discrete semiconductor components enable the optimization of individual performance features for specific circuit applications. By contrast thereto, what are usually restrictive compromises are necessary for process-oriented reasons given integrated circuits. Specialized discrete transistors are indispensable as a supplement of integrated circuits, specifically for modern communications and consumer electronics that increasingly opens up the frequency range above 1 GHz.

Si-npn transistors are available as active, discrete components for use in circuits up to approximately 4 GHz. Transistors on a GaAs substrate, particularly in the form of unipolar transistors or field effect transistors, exist for even higher frequencies. However, it is of considerable economic interest to expand the range of employment of discrete silicon transistors, particularly since silicon wafers can be processed significantly more inexpensively than gallium arsenide wafers.

Even though an extremely broad spectrum of discrete Si high-frequency transistors is available in the market place, they all have a common structure, that is, the silicon substrate of the active chip serves as the collector terminal. The silicon substrate, which, for example, is n+-doped, has its collector contacting (metallization) on the underside of the chip connected to the collector terminal of the housing or is arranged thereon and secured thereto. Emitter and base terminals to the semiconductor are implemented in extremely fine geometries ($\leq 1$ $\mu$m) on the upper side of the chip. The emitter and base terminals, for example, are applied on the doped emitter and base regions at the surface of the semiconductor chip in, for example, the form of an interdigital metallization structure. These emitter and base contactings are then each respectively connected via a bond wire to the appertaining emitter or base terminals of the housing. Such Si chips are integrated, for example, in an SMD (surface mounted device) housing, whereby the housing terminal on which the Si chip is applied defines the collector terminal of the housing. Emitter and base are bonded via gold wires to the remaining terminals of the housing. Both the chip as well as the bond wires are protected by the housing.

The range of employment of such components is characterized by the limit frequency $f_T$ which extends up to 10 GHz in commercially obtainable Si high-frequency transistors. A further increase of the limit frequency requires an improvement of the chip technology, for example on the basis of finer structures or shallower doping profiles.

However, it is not only the performance capability of the silicon chip that is significant for a marketable high-frequency component. On the contrary, the housing is becoming more important for frequencies above 1 GHz. It is to be considered a high-frequency network that transforms the impedances at the housing at the outside to the chip. In particular, the inductance in the emitter branch which necessarily occur due to long bond wires and housing lengths limits the gain that can be externally produced.

Attempts at housing optimization, multiple emitter bonding, etc., have produced only marginal improvements. A comparison of two chips having 40 GHz and 8 GHz in the described, so-called common collector structure clearly shows that the far better properties of the 40 GHz chip are absorbed by the housing. Although this performance data is documented by suitable measuring methods "on wafer", it is nonetheless not possible according to the previous common collector structure to achieve the desired high-frequency properties at the completely housed transistors.

SUMMARY OF THE INVENTION

It is an object of the present invention to provide a bipolar high-frequency transistor that, provided with a housing, enables a high gain at frequencies above 1 GHz.

In a bipolar high-frequency transistor of the type initially cited, this object is inventively achieved in that the base, collector and emitter contactings are provided at the upper side of the semiconductor chip. The semiconductor chip has its under side arranged on the emitter terminal of the housing which is fashioned as HF ground. The emitter contacting is connected at a short distance to the emitter terminal of the housing. The base contacting to the base terminal and the collector contacting to the collector terminal are each respectively connected to one another via at least one bond wire.

The emitter contacting at the upper side of the semiconductor chip is thereby connected via at least one bond wire to the emitter terminal of the housing on which the chip is secured with its underside. It can also be advantageous to connect the emitter contacting to the emitter terminal of the housing through the semiconductor chip in order to thus realize the shortest possible connection between emitter contact and emitter terminal of the chip. A method that is suitable for this purpose is what is referred to as the substrate via technique wherein a hole is etched through the substrate, this hole then being filled with a suitable metal as connecting medium.

The silicon substrate of the semiconductor chip is expediently p-doped in the region of the underside to be connected to the emitter terminal.

The active semiconductor chip is advantageously built into a surface-mountable, so-called SMD housing that is preferably composed of plastic. It can also be expedient to multiply conduct the emitter terminal of the housing out of the housing.

The advantages achieved with the present invention are particularly that a departure is made from the previous common collector concept and a common emitter configuration is introduced instead. It is important to bring the external high-frequency ground as close as possible to the active part of the transistor and to thus ground the emitter. According to this new configuration, the silicon body is connected to the emitter potential, that is, to the high frequency (HF) ground, and the semiconductor chip is mounted on the emitter terminal of the housing. Consequently, the collector terminal of the transistor chip is additionally conducted out at the upper side of the chip and is bonded to a corresponding housing terminal. The electrical connection of the emitter to the housing terminal preferably occurs via optimally short bond wires form the upper side of the chip in a downward direction or via the substrate through etched holes that are filled with metal. The base terminal is implemented in a traditional structure. Since the emitter contacting of the upper side of the chip lies at the same potential as the substrate, the area of the emitter metallization can be enlarged without additional parasitic capacitance. A multiple bonding of the emitter with low inductance is therefore possible.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

The single FIGURE is a schematic perspective view of the bipolar high-frequency transistor of the present invention.

DESCRIPTION OF THE PREFERRED EMBODIMENT

The bipolar high-frequency transistor shown in the Figure is composed of a semiconductor chip 1 of a silicon substrate that is expediently p-doped. At its upper side, the semiconductor chip 1 is suitably doped and structured in a known way in order to realize the desired base and emitter as well as collector contactings 2, 4, 3 on the upper side thereof which are finger-shaped in this example. The semiconductor chip 1 has its underside, the p-doped silicon substrate in this example, secured on the emitter terminal 5 of the housing 8, for example by gluing. The emitter terminal 5 is fashioned as a high-frequency ground, that is, it has an optimally low impedance. This is achieved in that the emitter terminal 5 is dimensioned optimally broad and optimally short toward the outside. Moreover, the emitter terminal 5 of the housing 8 should have an optimally high electrical conductivity. For example, the emitter terminal 5 is composed of copper that is expediently silver-plated or gold-plated. The emitter contacting 4 is connected to the emitter terminal 5 over an optimally short distance. In the exemplary embodiment, the short connection occurs via two bond wires 9 which, for example, are composed of gold. The two other metallizations, the collector contacting 3 and the base contacting 2 of the semiconductor chip 1, are also each respectively connected via bond wires 10, 11 to the respective housing terminals of the transistor, that is, to the collector terminal 7 and base terminal 6. The housing 8 which hermetically tightly surrounds both the semiconductor chip 1 and the bond wires 10, 11 as well as the inside parts of what is referred to as a lead frame that form the base terminal 6, the electric terminal 7 and emitter terminal 5 of the transistor is preferably composed of plastic. The housing 8 is expediently what is referred to as a SMD housing. To this end, the outwardly projecting parts of the electrical terminals 5, 6 and 7 of the high-frequency transistor are angled off in a suitable way that is not shown.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed:

1. A bipolar high-frequency transistor in a doped and structured semiconductor chip having a silicon substrate with base, collector and emitter contacts, said semiconductor chip being enclosed by a housing and said base, collector and emitter contactings being connected to respective base, collector and emitter terminals of the housing, comprising: the base, collector and emitter contacts being provided at an upper side of the semiconductor chip; the semiconductor chip having an underside arranged on the emitter terminal of the housing which is high frequency ground; the emitter contact connected over a short distance to the emitter terminal of the housing; and the base contact connected by at least one bond wire to the base terminal and the collector contact connected by at least one bond wire to the collector terminal.

2. The bipolar high-frequency transistor according to claim 1, wherein the emitter contact is connected to the emitter terminal of the housing by at least one bond wire.

3. The bipolar high-frequency transistor according to claim 1, wherein the emitter contact is connected to the emitter terminal of the housing through the semiconductor chip.

4. The bipolar high-frequency transistor according to claim 1, wherein the silicon substrate of the semiconductor chip is p-doped.

5. The bipolar high-frequency transistor according to claim 1, wherein the housing is a surface mounted device housing.

6. The bipolar high-frequency transistor according to claim 1, wherein the housing is a plastic housing.

7. The bipolar high-frequency transistor according to claims 1, wherein the emitter terminal of the housing is multiply bonded to the emitter contact of the semiconductor chip to provide low emitter inductance.

8. A bipolar high-frequency transistor, comprising: a doped and structured semiconductor chip having a silicon substrate and base, collector and emitter contacts, said semiconductor chip being enclosed by a housing, said housing having base, collector and emitter terminals; the base, collector and emitter contacts being provided at an upper side of the semiconductor chip; the semiconductor chip having an underside arranged on the emitter terminal of the housing which is high frequency ground; the emitter contact connected over a short distance to the emitter terminal of the housing; and the base contact connected by at least one bond wire to the base terminal and the collector contact connected by at least one bond wire to the collector terminal.

9. The bipolar high-frequency transistor according to claim 8, wherein the emitter contact is connected to the emitter terminal of the housing by at least one bond wire.

10. The bipolar high-frequency transistor according to claim 8, wherein the emitter contact is connected to the emitter terminal of the housing through the semiconductor chip.

11. The bipolar high-frequency transistor according to claim 8, wherein the silicon substrate of the semiconductor chip is p-doped.

12. The bipolar high-frequency transistor according to claim 8, wherein the housing is a surface mounted device housing.

13. The bipolar high-frequency transistor according to claim 8, wherein the housing is a plastic housing.

14. The bipolar high-frequency transistor according to claim 8, wherein the emitter terminal of the housing is multiply bonded to the emitter contact of the semiconductor chip to provide low emitter inductance.

15. A bipolar high-frequency transistor, comprising: a doped and structured semiconductor chip having a silicon substrate and base, collector and emitter contacts, said semiconductor chip being enclosed by a housing, said housing having base, collector and emitter terminals; the base, collector and emitter contacts being provided at an upper side of the semiconductor chip; the semiconductor chip having an underside arranged on the emitter terminal of the housing which is high frequency ground; the emitter contact connected over a short distance by at least two gold bond wires to the emitter terminal of the housing; and the base contact connected by at least one bond wire to the base terminal and the collector contact connected by at least one bond wire to the collector terminal.

16. The bipolar high-frequency transistor according to claim 15, wherein the emitter contact is connected to the emitter terminal of the housing through the semiconductor chip.

17. The bipolar high-frequency transistor according to claim 15, wherein the silicon substrate of the semiconductor chip is p-doped.

18. The bipolar high-frequency transistor according to claim 15, wherein the housing is a surface mounted device housing.

19. The bipolar high-frequency transistor according to claim 15, wherein the housing is a plastic housing.

20. The bipolar high-frequency transistor according to claim 15, wherein the emitter terminal of the housing is multiply bonded to the emitter contact of the semiconductor chip to provide low emitter inductance.

* * * * *